United States Patent
Lee et al.

(10) Patent No.: US 6,452,800 B2
(45) Date of Patent: *Sep. 17, 2002

(54) HEAT SINK ASSEMBLY FOR DISSIPATING HEAT OF AN ELECTRONIC PACKAGE MOUNTED ON AN ELECTRICAL SOCKET

(75) Inventors: Chao-Yang Lee, Taipei; Chao Kun Tseng, Tu-Chen; Chung-Yung Sun, Kee-Lung; Wei-Ta Lo, Miou-Li, all of (TW)

(73) Assignee: Hon Hai Precision Ind., Co., Ltd., Taipei Hsien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/884,348

(22) Filed: Jun. 18, 2001

Related U.S. Application Data

(63) Continuation-in-part of application No. 09/474,578, filed on Dec. 29, 1999, now Pat. No. 6,317,323.

(51) Int. Cl.$^7$ .................................................. H05K 7/20
(52) U.S. Cl. ........................ 361/703; 24/458; 257/727; 361/719
(58) Field of Search ........................ 174/16.3; 257/718, 257/719, 726, 727; 165/80.3, 185; 24/296, 453, 457, 458, 625; 248/505, 510; 267/150, 158, 160; 439/485, 487; 361/687, 695, 697, 703, 704, 709, 710, 711, 715, 717–719, 557, 832; 29/840, 890.03

(56) References Cited

U.S. PATENT DOCUMENTS

| | | | | | |
|---|---|---|---|---|---|
| 5,660,562 A | * | 8/1997 | Lin | .............................. | 439/487 |
| 5,684,676 A | * | 11/1997 | Lin | .............................. | 361/704 |
| 5,930,115 A | * | 7/1999 | Tracy et al. | ................. | 361/704 |
| 5,933,325 A | * | 8/1999 | Hou | ............................. | 361/704 |
| 5,933,326 A | * | 8/1999 | Lee et al. | ..................... | 361/704 |
| 6,061,239 A | * | 5/2000 | Blomquist | ................... | 361/704 |
| 6,295,203 B1 | * | 9/2001 | Lo | ............................... | 361/704 |
| 6,317,323 B1 | * | 11/2001 | Lee et al. | ..................... | 361/704 |

\* cited by examiner

Primary Examiner—Gerald Tolin
(74) Attorney, Agent, or Firm—Wei Te Chung

(57) ABSTRACT

A heat sink assembly for an electrical socket of the present invention comprises a heat sink and a latching member latching with a pair of lugs on the socket. The heat sink comprises a base plate and a plurality of fins projecting upward therefrom. A receiving channel is integrally formed between the fins in the base plate for receiving the latching member. A pair of positioning tabs depends downward from a bottom surface of the base plate to tightly engage in a slit between the electric socket and a CPU mounted thereon for positioning the heat sink assembly on the CPU and keeping it from moving along the CPU. The receiving channel and the fins extend in a first direction while the tabs extend in a second direction vertical to the first direction.

7 Claims, 4 Drawing Sheets

HEAT SINK ASSEMBLY FOR DISSIPATING HEAT OF AN ELECTRONIC PACKAGE MOUNTED ON AN ELECTRICAL SOCKET

CROSS-REFERENCE TO RELATED APPLICATION

This application is a continuation-in-part (C-IP) application of my U.S. patent application Ser. No. 09/474,578, filed on Dec. 29, 1999, entitled Heat Sink Assembly for An Electrical Socket and whose disclosure is incorporated by reference herein, now U.S. Pat. No. 6,317,323.

BACKGROUND OF THE INVENTION

1. Field of the Invention

The present invention relates to a heat sink assembly for dissipating heat of an electronic package mounted on an electrical socket, and particularly to a heat sink assembly which is effectively positioned on the socket, has a low cost and can improve the heat dissipating efficiency.

2. Description of Related art

Today's computer technology transmits information at higher and higher rates. As transmission speed increases, the heat produced by the internal electronic elements increases correspondingly. This heat must be dissipated efficiently, otherwise the rising temperature in the computer will cause a system malfunction.

Prior art Taiwan Patents Nos. 85209788, 84218687 and 83217100 disclose heat sink assemblies having a heat sink body in contact with an electronic element. The heat sink body is formed from extruded aluminum and comprises a bottom glazed surface abutting the electronic element to absorb heat therefrom and a plurality of fins projecting upward from a base to dissipate the heat. A latching member closely binds the heat sink to the electronic element by latching to a pair of lugs formed on a socket mounting the electronic element. However, a channel must be cut in the heat sink body for receiving the latching member, which complicates the manufacture process. Additionally, the smooth, glazed surface of the heat sink abuts the electronic element, so the heat sink body is difficult to position accurately and may easily slide along the electric element after assembly. Finally, sometimes there is a need to mount an additional fan beside the socket and the heat sink to enhance the heat dissipating effectiveness of the heat sink; however, the extending direction of the fins of the heat sink in the prior art is transverse to the air flowing direction of he additional fan, resulting in an unfavorable cooling effectiveness. Hence, an improved electrical connector is required to overcome the disadvantages of the prior art.

SUMMARY OF THE INVENTION

An essential object of the present invention is b provide a heat sink assembly which can be effectively positioned on a socket on which an electronic package (for example, a CPU) to be cooled is mounted. The heat sink assembly has a low cost, and can improve the heat dissipating effectiveness for the electronic package.

A heat sink assembly of the present invention for cooling an electronic package mounted on an electrical socket comprises a heat sink and a latching member. The heat sink comprises a base plate and a plurality of fins projecting upward from a top surface thereof. A receiving channel is integrally formed between the plurality of fins for receiving the latching member. The latching member is elongated, and has two latching ends for respectively engaging with two lugs of the socket, respectively. The two lugs are formed on two opposite lateral sides of the socket, respectively. The base plate defines an enlarged recess adjacent to receiving channel to prevent interference with the normal operation of the electric socket. A pair of positioning tabs depends downward from a bottom surface of the base plate for positioning the heat sink on a CPU mounted on the electric socket and keeping it from moving along the CPU. If necessary, an electrical fan is mounted beside the socket neighboring a corresponding lug of the socket, whereby when the fan is activated, airflow is generated to laterally flow through the heat sink. The fins together with the latching member receiving channel are integrally formed during extruding the heat sink, in which the fins and the channel are extended along the lateral direction when the heat sink is mounted on the socket. The positioning tabs are formed by subjecting the heat sink to a pressing operation. The tabs extend in a direction vertical to the lateral direction.

Other objects, advantages and novel features of the invention will become more apparent from the following detailed description of the present embodiment when taken in conjunction with the accompanying drawings.

DETAILED DESCRIPTION OF THE INVENTION

Figure 1:
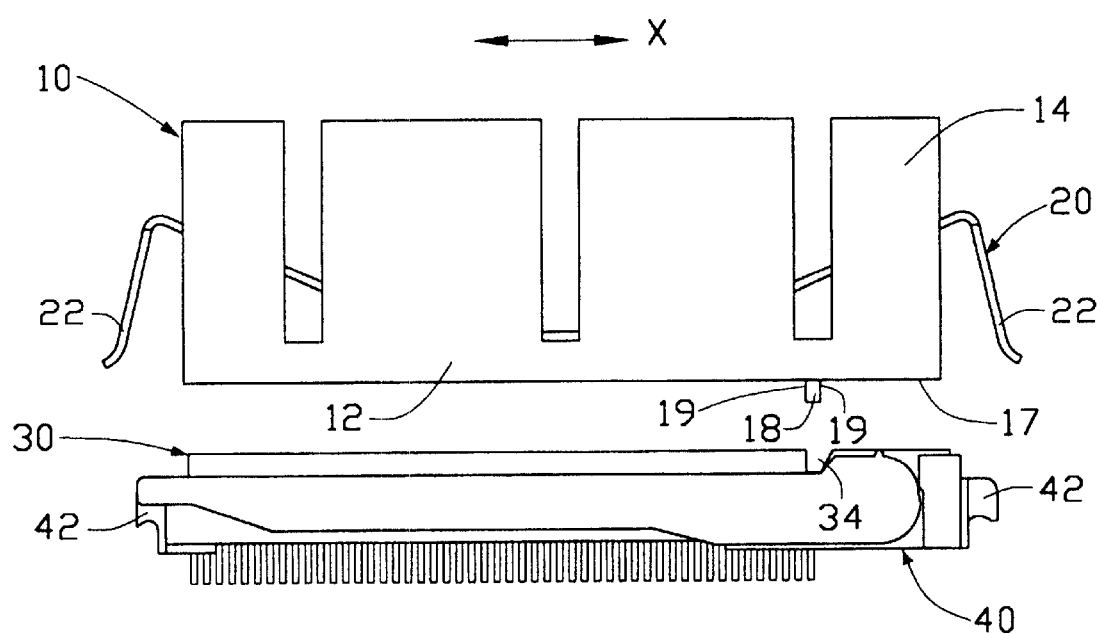
FIG. 1 is a front view of a heat sink assembly of the present invention with a CPU mounted on an electrical socket.
Figure 2:
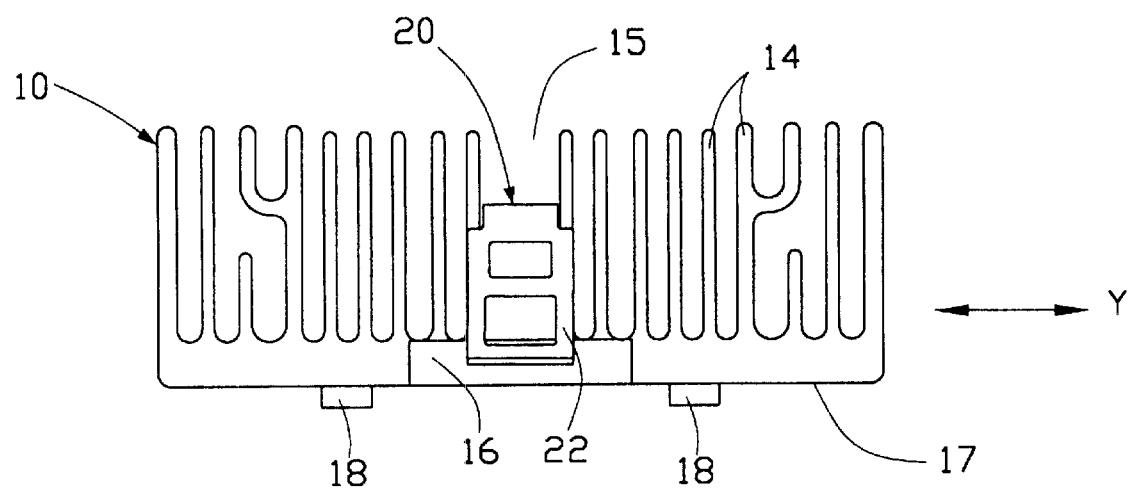
FIG. 2 is a right side view of a heat sink assembly of the present invention.

Reference will now be made to the drawing figures to describe the present invention in detail.

Figure 3:
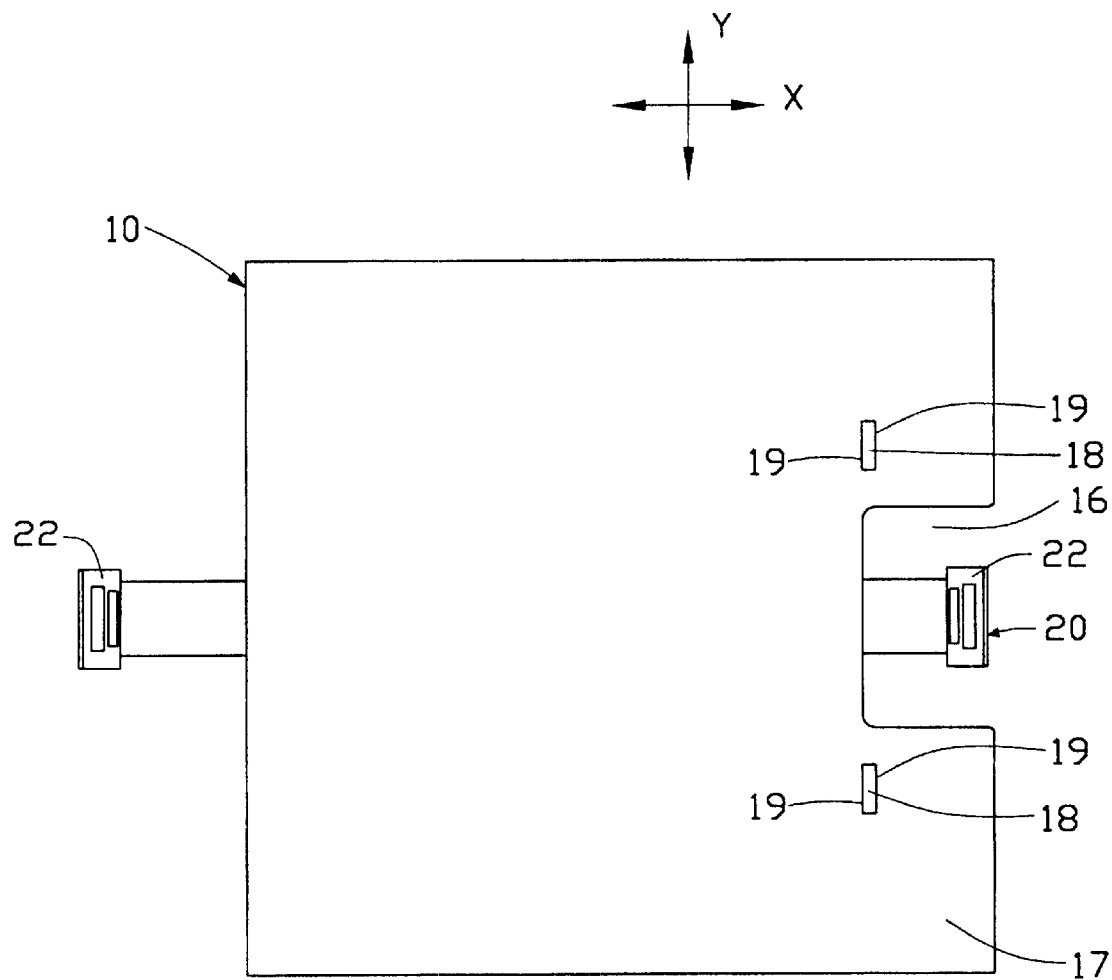
FIG. 3 is bottom view of a heat sink assembly of the present invention.
Figure 4:
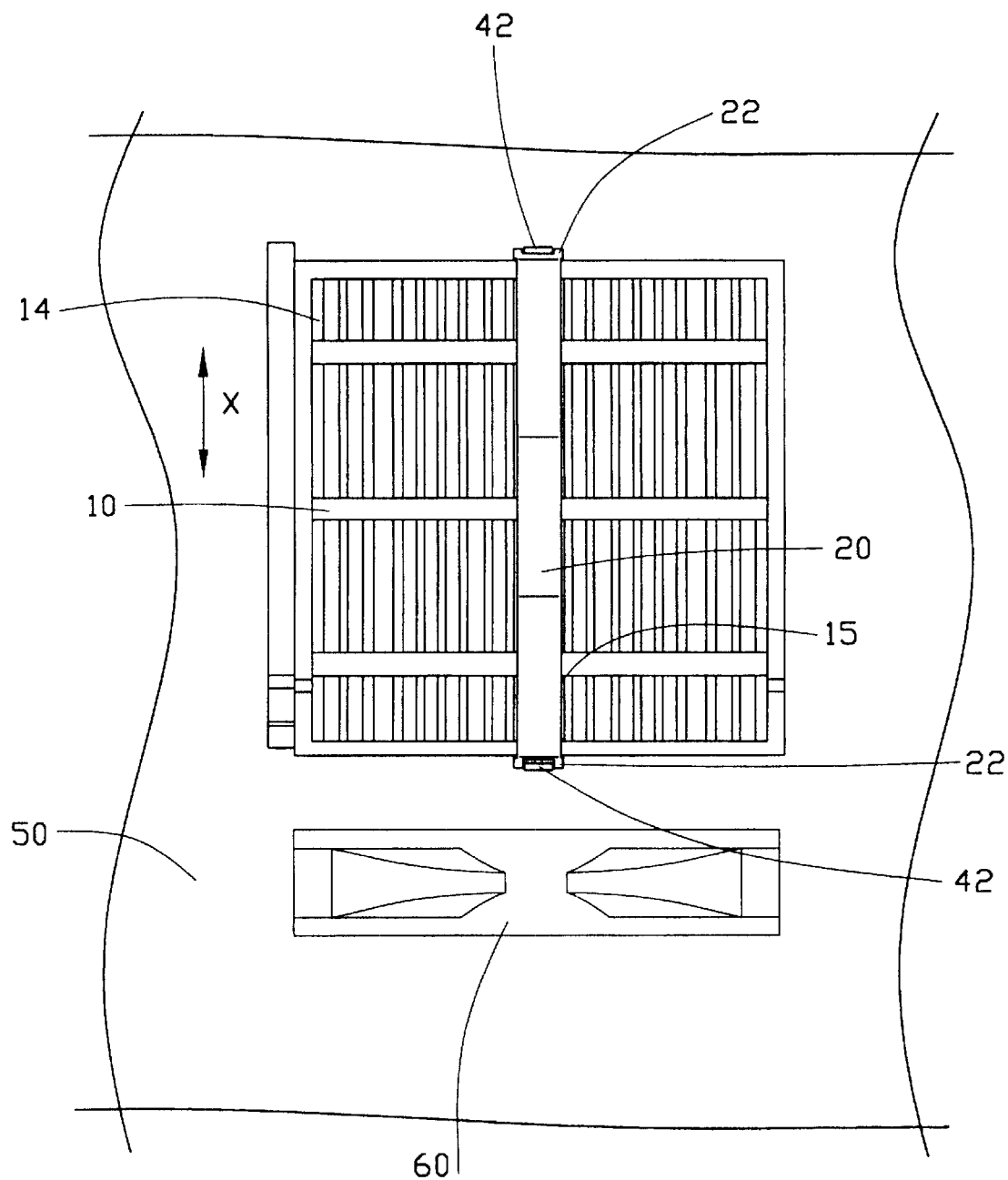
FIG. 4 is a top view showing the heat sink assembly fastened to the electrical socket which is mounted on a printed circuit board.

Referring to FIGS. 1 to 4, a heat sink assembly for an electrical socket of the present invention comprises a heat sink 10 and a latching member 20. The heat sink 10 is formed by extruding aluminum and comprises a base plate 12 and a plurality of fins 14 integral with the base plate 12 and projecting upward from a top surface thereof. A receiving channel 15 is integrally formed between the plurality of fins 14 in the base plate 12 when the heat sink 10 is extruded, for receiving the latching member 20, thereby simplifying the manufacture of the heat sink with respect to the prior art, which formed a receiving channel using a cutting means. In other words, the receiving channel 15 of the present invention is formed extending along the extruding direction of the heat sink 10 so that the receiving channel 15 can be simultaneously formed when the heat sink 10 is extruded. The fins 14 are extended in the same direction as that of the receiving channel 15. The base plate 12 comprises a bottom glazed surface 17 for abutting a CPU 30 to absorb the heat produced by the CPU 30. As best seen in FIG. 3, an enlarged recess 16 is defined at one side of the base plate 12 adjacent to the receiving channel 15 to prevent interference with the normal operation of an electrical socket 40 to which the heat sink assembly is fastened. A pair of positioning tabs 18 depends from the bottom surface 17 at both sides of the recess 16, each tab 18 forming a pair of side abutting surfaces 19. The tabs 18 are formed by subjecting the base plate 12 of the heat sink 10 to a pressing stamping operation. The latching member 20 has a curved shape and comprises a pair of latching arms 22 depending downward at each side of a middle section (no labeled) thereof.

The CPU 30 is mounted on an electrical socket 40, a slit 34 being defined therebetween which engages with the pair of positioning tabs 18. The electrical socket 40 forms a pair of lugs 42 at opposite sides thereof to latch with the pair of latching arms 22 of the latching member 20. One of said lugs 42 is formed on the socket 40 nearest to and parallel to the slit 34.

In assembly, the latching member 20 is engaged in the receiving channel 15 of the heat sink 10. The heat sink assembly is placed atop the CPU 30, the pair of positioning tabs 18 fitting in the slit 34 with each pair of side surfaces 19 thereof abutting against both inside surface (not labeled) of the slit 34. The heat sink assembly is then fastened to the electrical socket 40 by the pair of latching arms 22 latching the pair of lugs 42 of the electrical socket 40, the bottom surface 17 abutting the CPU 30 to absorb heat produced therefrom. The heat sink 10 is thereby securely positioned and is kept from moving along the CPU 30.

The lugs 42 of the electrical socket 40 are provided on two opposite lateral sides thereof, respectively. The heat sink 10 is fastened to the socket 40 in a manner that the fins 14 and the receiving channel 15 extend along the lateral direction (X-direction of the drawings), while the tabs fitting in the slit 34 between the CPU 30 and the socket 40 extend in a direction (Y=direction of the drawings) vertical to the lateral direction. By such design, the heat sink 10 can be firmly fastened to the socket 40 and the CPU 30. If necessary an electrical fan 60 can be mounted on a printed circuit board 50 on which the heat sink 10, the latching member 20, the socket 40 and the CPU 30 are also mounted. The electrical fan 60 is located near a side of the socket 40 on which one of the lugs 42 is formed. When the fan 60 is activated, an air is formed to flow through the heat sink 10 along the X-direction, whereby the air can flow through the heat sink 10 easily to effectively take away heat from the heat sink 10 and thus the CPU 30, since the fins 14 and the receiving channel are formed extending along the X-direction.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly comprising:
   a heat sink having a base plate, a plurality of fins on the base plate with a latching member receiving channel formed between the fins, wherein both the fins and the channel extend in a first direction along which the heat sink is extruded, and at least a tab formed on an underside of the base plate opposite to said fins and extending in a second direction perpendicular to the first direction; and
   a latching member received in the channel.

2. The heat sink assembly as claimed in claim 1, wherein a recess is defined in a side of the base plate of the heat sink adjacent to the channel.

3. The heat sink assembly as claimed in claim 2, wherein the heat sink has two tabs located at two sides of the recess.

4. The heat sink assembly as claimed in claim 1, wherein the tabs are formed by stamping the base plate of the heat sink.

5. An electrical assembly, comprising:
   an electrical socket, the socket having two lugs formed on two opposite lateral sides thereof, respectively;
   an electronic package mounted on the socket;
   a heat sink mounted on the electronic package, the heat sink having a base plate, a plurality of fins on the base plate, a latching member receiving channel formed between the fins, wherein both the fins and the channel extend in a lateral direction through the two lateral sides of the electrical socket, and at least a tab is formed on an undersurface of the base plate opposite to said fins, the tab extending in a direction perpendicular to the lateral direction and fitting in a slit between the electronic package and the socket; and
   a latching member received in the channel, the latching member having two depending latching arms respectively engaging with the lugs;
   wherein the heat sink is extruded along the lateral direction.

6. The electrical assembly as claimed in claim 5 further comprising an electrical fan located neighboring one of the lateral sidesof the electrical socket, wherein when the fan is activated, an air flows through the heat sink along the lateral direction.

7. A method for forming a heat sink, comprising:
   (a) providing an aluminum mass;
   (b) subjecting the aluminum mass to an extruding operation to simultaneously form a base plate, a plurality of fins on a top face of the base plate, and a latching member receiving channel between the fins, in which the fins and the channel extend in a first direction and the receiving channel is used for receiving a latching member for fastening the heat sink to an electrical socket; and
   (c) subjecting the product obtained by step (b) to a pressing operation to form at least one tab on a bottom face of the base plate, the tab extending in a second direction perpendicular to the first direction.

* * * * *